United States Patent [19]

Kuroda et al.

[11] 4,435,897
[45] Mar. 13, 1984

[54] METHOD FOR FABRICATING SOLID-STATE IMAGE SENSOR

[75] Inventors: Takao Kuroda, Osaka; Kenju Horii, Shiga, both of Japan

[73] Assignee: Matsushita Electronics Corporation, Osaka, Japan

[21] Appl. No.: 320,845

[22] Filed: Nov. 12, 1981

[30] Foreign Application Priority Data

Nov. 19, 1980 [JP] Japan ................................ 55-163654

[51] Int. Cl.³ ............................................. H01L 31/10
[52] U.S. Cl. ........................................ 29/572; 29/578; 357/24; 148/1.5
[58] Field of Search ..................... 29/572, 576 B, 578, 29/569 R; 357/24 LR, 24 M; 148/1.5

[56] References Cited

U.S. PATENT DOCUMENTS 4,173,064 11/1979 Farnow ................................ 29/578

Primary Examiner—Brian E. Hearn
Assistant Examiner—David A. Hey
Attorney, Agent, or Firm—Burgess, Ryan & Wayne

[57] ABSTRACT

In the fabrication of a solid-state image sensor of the type having a plurality of photoelectric transducer means on a semiconductor substrate of one conductivity, excessive charge drain regions each provided with a plurality of first electrodes and second electrodes which function as a gate for controlling the drain of excessive charge, impurities or dopants of the other conductivity are introduced immediately below each of the regions at which the first electrodes are to be formed; thereafter, the first and second electrodes are formed; and impurities or dopants which are same as the above-described impurities or dopants are introduced while using the first and second electrodes as a masking pattern, whereby the photoelectric transducer means and drain regions are formed.

1 Claim, 10 Drawing Figures

METHOD FOR FABRICATING SOLID-STATE IMAGE SENSOR

BACKGROUND OF THE INVENTION

The present invention relates to a solid-state or charge-coupled image sensor.

According to the prior art method for fabricating solid-state image sensors, prior to the formation of CCD gate electrodes and overflow control gates, overflow drains are formed by the dopant introduction step such as an ion-implantation or thermal diffusion step. Therefore, due to accumulated dimensional variations which in turn are due to manufacturing tolerances in lithographic steps the overflow control gates and overflow drains are misaligned and they are very frequently overlapped. As a consequence, the channel length varies from one overflow control gate to another and consequently a saturation charge varies from one photodiode to another. Therefore, even when the image sensor is uniformly exposed, a photodiode in a charge-coupled unit cell whose overflow-control-gate channel length is shorter is saturated faster. As a result, the luminous intensity varies from one spot to another on a cathode-ray tube.

SUMMARY OF THE INVENTION

The present invention was made to overcome the above and other problems encountered in the prior art solid-state image sensor. According to the present invention, the channel of the overflow control gate is formed by the self-alignment diffusion method so that variations in channel length can be reduced to a minimum. Of the overflow drain, a region which cannot be formed by said alignment diffusion is formed by another dopant introduction step such as an ion-implantation or thermal diffusion step, whereby the whole structure of the overflow drain can be formed as an impurity diffused or implanted region of the same conductivity.

More specifically, in the fabrication of the solid-state image sensor of the type having a plurality of photoelectric transducer means such as photodiodes formed on a semiconductor substrate of one conductivity type, excessive charge drain regions each provided with a plurality of first electrodes and second electrodes for controlling the drain of excessive charge, impurities or dopants of the other conductivity type are introduced immediately below each of the regions at which the first electrodes are to be formed; thereafter, the first and second electrodes are formed; and then impurities or dopants same as the first-mentioned impurities or dopants are introduced while using the first and second electrodes as a masking pattern, whereby the photoelectric transducer means and drain regions are formed.

DETAILED DESCRIPTION OF THE PRIOR ART

Figure 1:
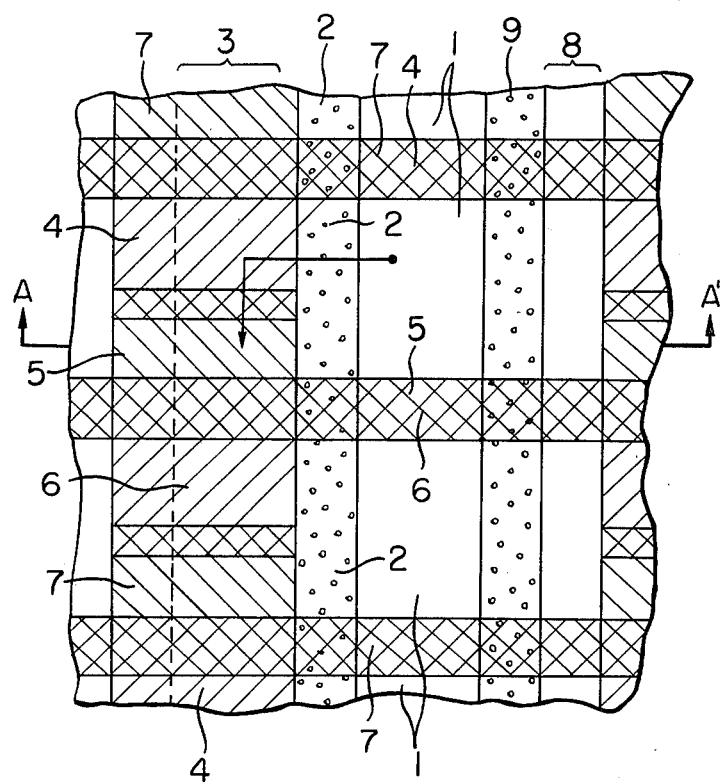
FIG. 1 is a top view of a prior art solid-state image sensor.

In FIG. 1 is shown an interline transfer type charge-coupled device (CCD) image sensor in which a photodiode (PD) implemented on a p-type substrate functions as a photoelectric transducer means and a four-phase, n-channel, buried channel charge-coupled device (CCD) functions as a vertical-transfer shift register (V-BCCD).

Reference numeral 1 denotes a photodiode (PD) which collects signal charge generated by the photoelectric reaction; 2, a transfer gate through which the signal charge collected by $PD_1$ is transferred to a V-$BCCD_3$; 4, 5, 6 and 7, gate electrodes $\phi_1-\phi_4$, respectively, of V-$BCCD_3$ for vertical transfer of the signal charge transferred from $PD_1$. These transfer gates 4–7 are formed on V-$BCCD_3$ and extended in the row direction so that they can be electrically connected to the transfer gates of other V-BCCDs. Reference numeral 8 is an overflow drain (OFD) which discharges an excessive amount of electron charge which is generated by the over-exposure of $PD_1$ and cannot be stored therein so that the excessive charge cannot overflow into V-$BCCD_3$; and 9, an overflow control gate (OFCG) to which is applied a voltage which determines a potential threshold for initiating the overflow.

Figure 2A:
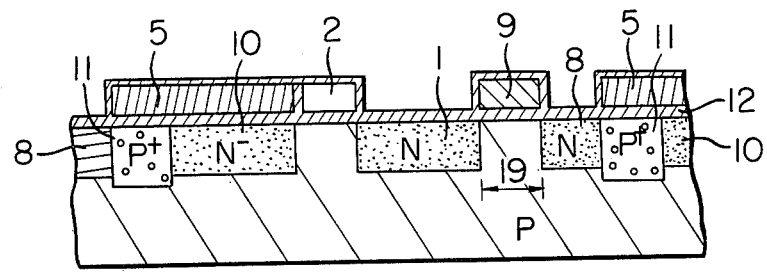
FIG. 2A is a sectional view thereof taken along the line A—A' of FIG. 1.

FIG. 2A is a sectional view taken along the line A—A' of FIG. 1. Reference numeral 10 represents the channel region of V-$BCCD_3$; 11, a channel stopper for avoiding the overflow of charge; and 12, a $SiO_2$ layer.

Figure 2B:
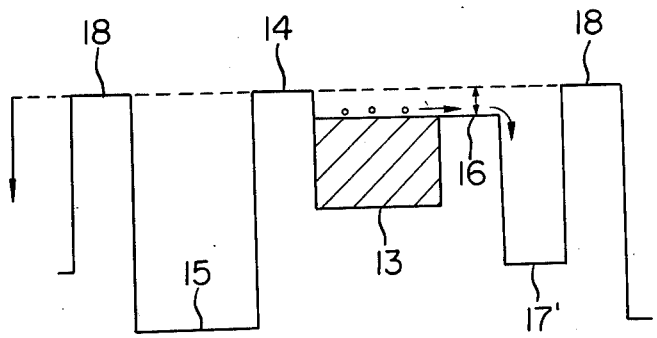
FIGS. 2B and 2C are potential energy profiles used to explain the mode of operation of the solid-state image sensor as shown in FIG. 1 or FIG. 2A.

FIG. 2B shows a potential-energy profile corresponding to FIG. 2A. Numeral 13 indicates a potential level of the n-type layer of $PD_1$ in the absence of the signal charge; 14, a potential level of the channel of the transfer gate 2 during the signal charge collection time interval; 15, a channel potential of V-$BCCD_3$ in the absence of signal charge; 16, a channel potential of OFCG 9; 17, a potential of OFD 8; and 18, a potential of the channel stopper 11.

As described previously, the gate electrodes 4, 5, 6 and 7 of V-$CCD_3$ are extended horizontally so that they can be connected in common with those of other V-CCDs in respective rows. More specifically, they are extended across not only V-$BCCD_3$ but also the transfer gate 2, $PD_1$, OFCG 9 and OFD 8.

Figure 3A:
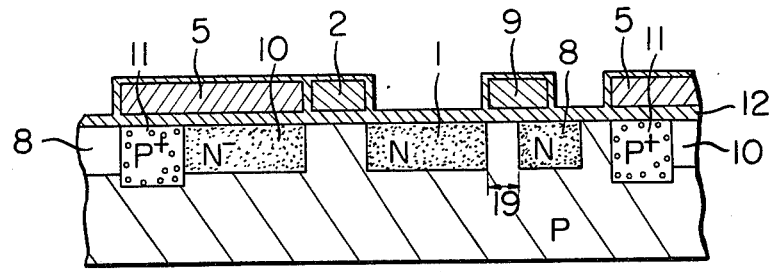
FIG. 3A is a sectional view of a prior art solid-state image sensor in which an overflow drain is misaligned because of the fabrication by a prior art method.

If it is desired to provide the whole OFD 8 in a dopant diffusing or implantation step, it must be formed prior to the formation of the gate electrodes 4, 5, 6 and 7. In practice, before the formation of the CCD gate electrodes 4, 5, 6 and 7 and OFCG 9, OFD 8 is formed by an ion-implantation or thermal diffusion step. Since OFCG 9 is formed after OFD 8 has been formed, self-alignment diffusion cannot be attained. As a consequence, a misalignment of the relative position between OFCG 9 and OFD 8 is dependent upon photolithographic and etching errors. And this misalignment occurs very often so that the structure as shown in FIG. 3A results. That is, OFD 8 and OFCG 9 are partially overlapped. The comparison between the structures as shown in FIGS. 2A and 3A shows that the length 19 of the channel for OFCG 9 is extremely shorter in the structure as shown in FIG. 3A than in the structure as shown in FIG. 2A. In general, an optimum channel length for OFCG 9 is of the order of a few micrometers with a maximum tolerance (that is, the difference in channel length 19 between the structures as shown in FIGS. 2A and 3A) of 1.5 to 2 micrometers.

Even when the same voltage is applied to OFCGs, the channel potential 16 of the structure with a short channel length 19 as shown in FIG. 3A becomes higher because of the short-channel effect. To put in another way, the shorter the channel length 19, the lower the threshold potential at which the excessive charge is overflown into OFD 8.

Figure 3B:
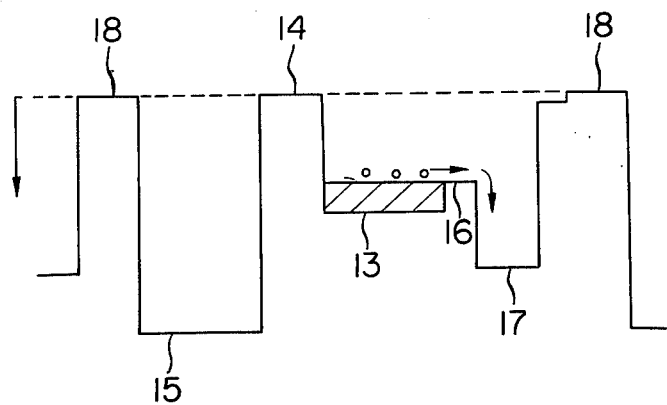
FIGS. 3B and 3C show potential energy profiles used for the explanation of the mode of operation of the solid-state image sensor as shown in FIG. 3A.

If the channel lengths are not uniform in a single image sensor, a saturation, or full, charge varies from one PD unit to another (as indicated by the hatched regions in FIGS. 2B and 3B) so that even when uniformly exposed, PD in a charge-coupled unit cell with a shorter channel length is saturated faster. As a result, even when the image sensor is uniformly irradiated, the luminous intensity varies from one spot to another on the screen of a cathode-ray tube.

Figure 2C:
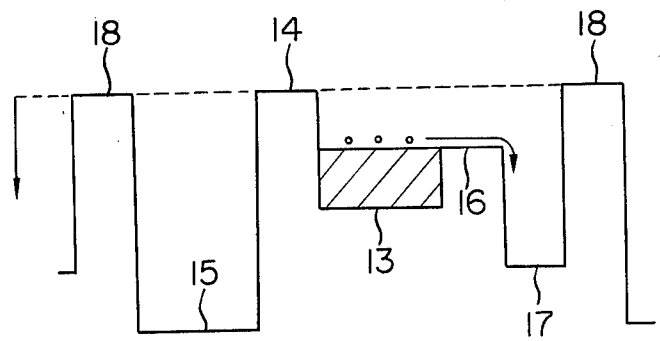
Figure 3C:
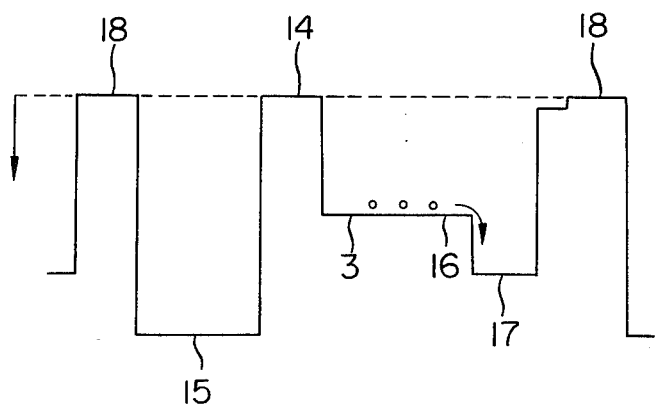

In an extreme case, a higher positive voltage is applied to OFCG 9. Then, the potential profile as shown in FIG. 2C or 3C is obtained. In FIG. 2C, PD still has some storage capacity, but in FIG. 3C all the electrons generated flow into OFD 8 so that no signal is derived from PD. As a consequence, a black dot is displayed on the cathode-ray tube, causing fixed-pattern noise which adversely affects the image quality.

In order to overcome this problem, there has been proposed a method for increasing the width of OFCG 9 so that adverse effects due to nonuniform channel lengths can be relatively minimized. However, the channel width 10 of $PD_1$ of V-BCCD is reduced so that sensitivity, a saturation charge and other characteristics are degraded.

DESCRIPTION OF THE PREFERRED EMBODIMENTS

Figure 4:
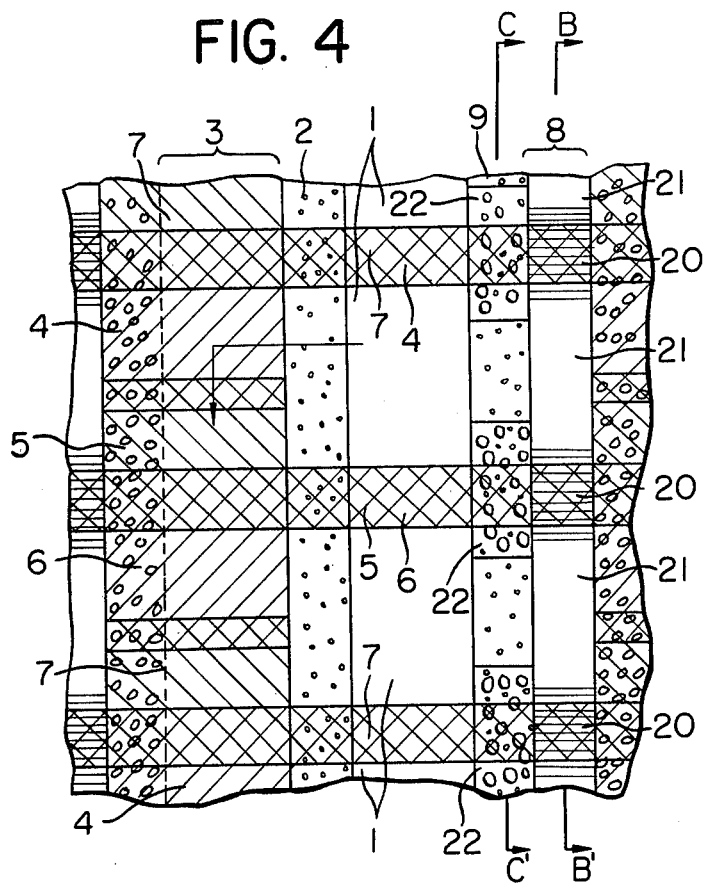
FIG. 4 is a top view of a solid-state image sensor fabricated by the method of the present invention.

Next, referring to FIGS. 4 and 5, the present invention will be described in detail. In the case of the solid-state image sensor as shown in FIG. 1, OFD 8 is formed by one dopant implantation or diffusion step, but according to the present invention, only a region 20 is formed by one dopant implantation or diffusion step and then OFCG 9 is formed. Of course, the region 20 may be formed after OFCG 9 has been formed. Thereafter, dopants are introduced into the $PD_1$ region and the remaining region of OFD 8 (that is the region except 20) by a similar dopant introduction step such as ion-implantation or thermal diffusion step. Therefore, the channel of OFCG 9 is formed by self-alignment diffusion so that nonuniformity in channel length which presents very serious problems as described above can be eliminated. As a result, uniform blooming inhibition effect can be attained over the whole surface of the image sensor.

Figure 5A:
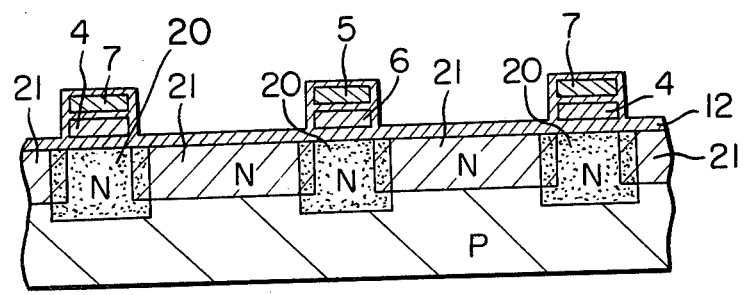
FIGS. 5A and 5B are sectional views thereof.

In practice, unless the regions 20 and 21 of OFD 8 are isolated from each other, no charge flows out through OFD 8 and consequently no excessive charge is drained. FIG. 5A is a sectional view taken along the line B—B' of FIG. 4 and shows overlapping between the regions 20 and 21.

Figure 5B:
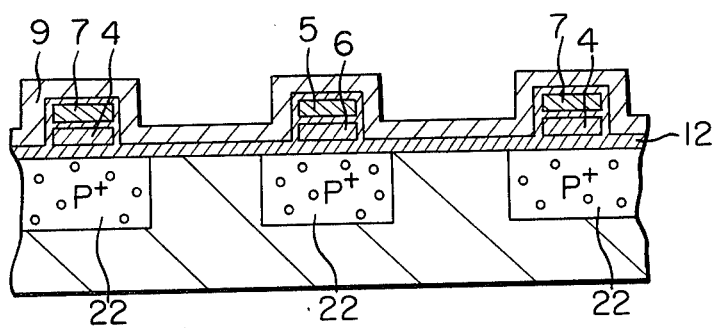

A channel-stopper or P+ layer 22 is formed so as to surround the region 20 as shown in FIG. 5B. As a result, even if the region 20 is formed below OFCG 9, it will not function as an OFCG channel and consequently the above-described problems can be eliminated.

The region 20 can be formed simultaneously with the formation of the channel 10 of V-BCCD by a dopant introduction step so that one mask can be eliminated as compared with the prior art photolithographic methods.

So far, the present invention has been described in conjunction with the interline transfer type charge-coupled image sensor, but it is to be understood that the present invention can be equally applied to the MOS type image sensor in which MOS switches are used to accomplish the vertical reading because readout gates are arranged in the horizontal direction. So far, the present invention has been described in conjunction with the n-type channel, but it is to be understood that the present invention can be equally applied to the p-type channel.

What is claimed is:

1. A method for the fabrication of a solid-state image sensor of the charge-coupled type having a plurality of photoelectric transducer means on a semiconductor substrate of one conductivity type, a corresponding plurality of excessive charge drain regions coupled to respective ones of said transducer means, and a plurality of first electrodes and second electrodes which function as gate electrodes overlying corresponding channels coupled between said transducer means and said excessive charge drain regions for controlling the discharge of excessive charge from each of said transducer means to the corresponding excessive charge drain region, said method comprising the steps of:

forming channel stopper regions by introducing impurities of the same conductivity type as the substrate into each zone where a channel is situated and into each zone where a corresponding excessive charge drain region is situated, said impurities being introduced from the zones where each first electrode and each second electrode are situated, and introducing impurities with conductivity type opposite to that of the substrate into the excessive charge drain region of the zone where each first electrode is formed;

forming said first electrodes and said second electrodes on a surface of said substrate overlying corresponding channels; and introducing conductivity-type-determining impurities into the surface of said substrate upon which said first and second electrodes are formed, using said electrodes as a diffusion mask, to form said excessive charge drain regions and said photoelectric transducer means in said substrate.

* * * * *